United States Patent [19]

Tarng et al.

[11] 4,404,235

[45] Sep. 13, 1983

[54] METHOD FOR IMPROVING ADHESION OF METAL FILM ON A DIELECTRIC SURFACE

[75] Inventors: Ming L. Tarng, Mercerville, N.J.; Walter A. Hicinbothem, Jr., Levittown, Pa.

[73] Assignee: RCA Corporation, New York, N.Y.

[21] Appl. No.: 237,415

[22] Filed: Feb. 23, 1981

[51] Int. Cl.³ .......................................... H01L 21/285
[52] U.S. Cl. ................................ 427/89; 204/192 C; 427/91; 427/124; 427/253; 427/255.1
[58] Field of Search ................ 427/91, 89, 255.1, 253, 427/124; 204/192 C

[56] References Cited

U.S. PATENT DOCUMENTS 3,477,872 11/1969 Amick .
3,785,862 1/1974 Grill .
4,349,408 9/1982 Tarng .................................... 427/91

OTHER PUBLICATIONS

Shaw et al., "Vapor-Deposited Tungsten as a Metallization and Interconnection Material for Silicon Devices", RCA Review, Jun. 1970, pp. 306–327.

Primary Examiner—John D. Smith
Attorney, Agent, or Firm—Birgit E. Morris; Donald S. Cohen; Kenneth R. Glick

[57] ABSTRACT

The surface of a dielectric is exposed to gaseous $WF_6$ and $H_2$ at a temperature between approximately 500° C. and 650° C. This initiates the formation of tungsten islands on the dielectric surface without damaging the surface. An appropriate metallization layer is then deposited from the vapor phase onto the tungsten island covered dielectric surface.

8 Claims, 2 Drawing Figures

METHOD FOR IMPROVING ADHESION OF METAL FILM ON A DIELECTRIC SURFACE

BACKGROUND OF THE INVENTION

The present invention relates generally to the deposition of thin films. More particularly, it relates to a process for forming an adherent metal film on the surface of a dielectric material.

In the semiconductor device manufacturing industry, it is frequently desirable to generate layers of metal film on dielectric surfaces. For example, multilevel interconnection structures, commonly used on both bipolar and field effect semiconductor devices, typically incorporate a platinum or nickel metal film disposed on a polyimide, silicon nitride, silicon dioxide or phosphosilicate glass (PSG) dielectric. Although these structures are commonly employed in the semiconductor industry, a frequently encountered problem is metal to dielectric adherence.

U.S. Pat. No. 3,477,872, METHOD OF DEPOSITING REFRACTORY METALS, J. A. Amick, issued Nov. 11, 1969, and U.S. Pat. No. 3,785,862, METHOD FOR DEPOSITING REFRACTORY METALS, W. A. Grill, issued Jan. 15, 1974, both disclose methods for depositing refractory metals on silicon dioxide surfaces. Both of these methods involve initially etching the silicon dioxide surface and then depositing the desired tungsten or molybdenum refractory layer. Although these two references disclose techniques for improving refractory metal/silicon dioxide adherence, they are not directed to the adhesion of other metal systems on other types of dielectric surfaces. With the increase in popularity of polyimide and other non-silicon dioxide dielectric layers, it has become desirable to develop a means for improving metal adhesion to these other dielectrics as well. In response to this need, the present invention, which is applicable to metal/dielectric layers generally, has been developed.

SUMMARY OF THE INVENTION

To improve metal-to-dielectric adherence, the dielectric surface is first exposed to gaseous tungsten hexafluoride ($WF_6$) and hydrogen at a temperature between approximately 500° C. and 650° C. This has bee observed to create a matrix of tungsten islands on the dielectric surface, essentially roughening the dielectric surface without damaging it. The desired metal film is then deposited, from the vapor phase, over this tungsten island adherence layer, forming an enhanced metal/dielectric bond.

DETAILED DESCRIPTION

Figure 1:
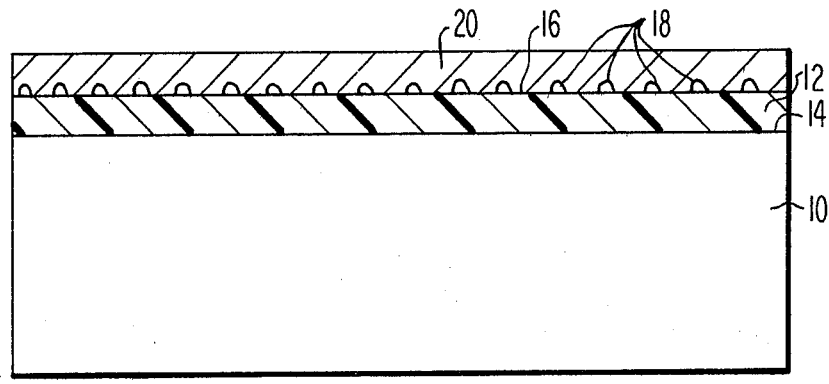
FIG. 1 is a sectional view of the metal/dielectric structure of the present invention.

FIG. 1 illustrates the present invention in its most basic form. A substrate 10 is provided and a dielectric film 12 is disposed on a major surface 14 thereof. There are no particular requirements for the material of the substrate, although in the preferred embodiment it will typically be a semiconductor material such as silicon or gallium arsenide. Similarly, there are no particular constraints on the material of the dielectric layer 12 although in the preferred embodiment the material will be one that is conventionally used in semiconductor processing, such as polyimide, silicon nitride, silicon dioxide, or PSG. The dielectric layer 12 has a relatively smooth surface 16 on which a discontinuous adherence layer 18 of tungsten is disposed. This adherence layer 18 is a substantially uniform distribution of islands of tungsten, the islands having optimal dimensions on the order of approximately 0.1–1.0 micron. The percentage of the dielectric surface 16 area covered by tungsten islands (i.e., the density of the adherence layer) is optimally approximately 50%, although varying degrees of effectiveness occur with densities in the 10%–90% range. Disposed on the adherence layer 18 and on the dielectric surface 16 between the tungsten islands is a layer of metallization 20. The metallization layer 20 can be a conventionally vacuum deposited interconnection material such as platinum or nickel.

In the present invention, the adherence layer 18 is generated by the chemical vapor deposition of tungsten from a mixture of $WF_6$ and hydrogen according to the reaction $WF_6 + 3H_2 \rightarrow W \downarrow + 6HF \uparrow$. This is performed at a temperature ranging between approximately 500° C. and 650° C., with a preferred temperature of approximately 550° C. At lower temperatures (less than 500° C.) an insufficient quantity of tungsten is formed on the dielectric surface, whereas at higher temperatures (greater than 650° C.) the growth rate of the tungsten islands becomes too high to easily control, making it difficult to obtain optimal island size and separation. Typical reaction time is between approximately 1 and 5 minutes, although varying such parameters as reaction temperature, hydrogen quantity and flow rate, and reaction time, will vary the size and density of the islands. Additionally, the reaction can be performed at atmospheric pressure or at low pressure and an inert gas, such as argon, can be used as a diluent in the $WF_6/H_2$ gas mixture.

The following two examples are presented to further illustrate the invention, and are not intended to limit the scope of the invention further than is stated in the subjoined claims.

EXAMPLE A

An adherence layer was deposited by Atmospheric Pressure Chemical Vapor Deposition (APCVD) onto a $SiO_2$ layer on a semiconductor substrate. The substrate was placed into a deposition chamber and the chamber was heated to approximately 600° C., pumped down to vacuum, and argon back filled, so as to provide argon at a positive pressure. Hydrogen was then introduced at a flow rate of approximately 6 liters/min, and argon was introduced at a flow rate of approximately 3 liters/min, such that the system was maintained at slightly above atmospheric pressure. Tungsten hexafluoride was next introduced into the argon stream in a pulsed fashion. During each pulse the $WF_6$ flow rate was 10 ml/min, and the full cycle comprised 10 pulses, each of 20 second duration at 40 second intervals. The deposition chamber was then cooled down to room temperature while continuing the $H_2$ flow, and the substrate was removed. The substrate, with its tungsten island covered $SiO_2$ layer, was then placed in a conventional planar magnetron sputter deposition chamber wherein a 2000 Angstrom thick platinum layer was conventionally deposited.

EXAMPLE B

An adherence layer was deposited by Low Pressure Chemical Vapor Deposition (LPCVD) onto a $SiO_2$ layer on a semiconductor substrate. After placing the substrate into a deposition chamber the chamber was heated to approximately 535° C. and pumped down to a pressure of $10^{-3}$ Torr. Tungsten hexafluoride was then introduced at a pressure of approximately 3 Torr. Next, hydrogen was introduced and the $WF_6$ flow rate was adjusted such that the total pressure was 3 Torr. The ratio of $H_2:WF_6$ (volume) flow rates was approximately 15:1. After 3½ minutes of the $H_2/WF_6$ flow, the $WF_6$ flow was terminated, and 1 minute later the hydrogen flow was terminated. The deposition chamber was then cooled to room temperature while maintaining vacuum, and the substrate was removed. The substrate, with its tungsten island covered $SiO_2$ layer was then placed in a conventional planar magnetron sputter deposition chamber wherein a 2000 Angstrom thick platinum layer was conventionally deposited.

The term APCVD refers generally to depositions performed at near atmospheric pressure. The term LPCVD refers generally to depositions performed at pressures lower than approximately 0.1 atmospheres (76 Torr). For both APCVD and LPCVD in the present invention, when the adherence layer is formed the $H_2:WF_6$ ratio is much higher than the stoichiometric requirement for the chemical reaction between $H_2$ and $WF_6$. The stoichiometric $H_2:WF_6$ ratio for the chemical reaction $WF_6 + 3H_2 \rightarrow W \downarrow + 6HF \uparrow$ is 3:1. However, during the APCVD or LPCVD of the present invention, the $H_2:WF_6$ ratio should be maintained within either the 10:1 to 20:1 range, or the 400:1 to 800:1 range, respectively. During APCVD, the $WF_6$ partial pressure is approximately $10^{-3}$ atmospheres (0.76 Torr), and during LPCVD the $WF_6$ partial pressure is approximately $2 \times 10^{-4}$ to $4 \times 10^{-4}$ atmospheres (0.15 to 0.30 Torr). Therefore, as far as the reactants are concerned, the rate of tungsten island formation is controlled primarily by the $WF_6$ flow rate at its particular partial pressure. For both APCVD and LPCVD the $WF_6$ partial pressure should be less than approximately 1 Torr to facilitate control over the rate of tungsten island formation.

Figure 2:
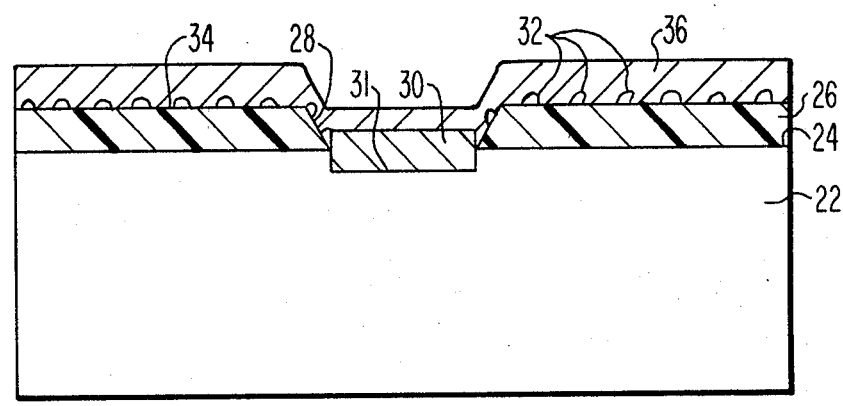
FIG. 2 illustrates the present invention incorporated with a Schottky barrier diode contact to a semiconductor substrate.

FIG. 2 illustrates the present invention embodied in a Schottky diode structure. The structure includes a semiconductor substrate 22 having a major surface 24 and a dielectric layer 26 disposed on the surface 24. An opening 28 in the dielectric layer 26 defines the region in which the diode is to be located, and a suitable barrier material 30 is disposed on the substrate 22 in the area described by the opening 28, so as to form a Schottky barrier diode 31 at the barrier material 30/substrate 22 interface. A tungsten island adherence layer 32 is disposed on the surface 34 of the dielectric layer 26, and a metallization layer 36 is disposed on the adherence layer 32 and on the barrier metal 30.

The described structure can be fabricated using conventional semiconductor processing apparatus. In a typical processing sequence, the dielectric layer 26 might be a polyimide film, and it might be formed by depositing polyimide in liquid form on the surface 24 of a silicon substrate, and then whirling the substrate 22 so as to create a relatively uniform layer 26. The opening 28 can be formed using standard photolithographic pattern generation and etching steps, and the barrier metal 30 can be deposited by a process such as chemical vapor deposition (CVD). In the preferred embodiment the barrier material 30 is tungsten. It is formed on the substrate portion defined by the opening 28 from the CVD deposition of $WF_6$, alone, at a temperature of approximately 550° C. However, it has been observed that although the surface 34 of the dielectric layer 26 is exposed during the $WF_6$ CVD deposition, a tungsten film does not form on the dielectric surface 34. This difference in deposition characteristic occurs because of the different materials involved.

The mechanism of CVD deposition of tungsten on silicon is one of chemical interaction rather than physical deposition. Tungsten atoms physically replace silicon atoms at the surface of the substrate 22 according to the reaction $2WF_6 + 3Si \rightarrow 2W \downarrow + 3SiF_4 \uparrow$, and create a Schottky barrier interface 31 at some depth with respect to the original substrate surface 24. However, this replacement reaction does not occur on the dielectric surface 34 even when the dielectric film 26 is a material such as $SiO_2$.

The adherence layer 32 is formed similarly to the adherence layer 18 of FIG. 1: by subjecting the polyimide layer 26 to $WF_6$ and $H_2$ at a temperature between approximately 500° C. and 650° C. for a period of approximately 1 to 5 minutes. Adding hydrogen to the aqueous $WF_6$ creates agglomerations of pure tungsten into islands on the dielectric surface and continues the formation of a uniform tungsten film on the barrier material 30. The time and temperature of the ($WF_6 + H_2$) deposition as well as the flow rates and densities of the $WF_6 + H_2$ gases should again be regulated so as to yield a discontinuous layer of tungsten islands 32 on the dielectric surface 34.

The metal film 36 is then deposited on the surface of the adherence layer 32 and on the barrier material 30. In the preferred embodiment the metallization 36 is a sputter deposited platinum film and it might serve as an interconnection for a plurality of Schottky diodes. Alternatively, the metallization might be further patterned so as to form a field plate for increasing the breakdown voltage on the illustrated diode 31.

The described layer 32 significantly enhances the adherence of overlying metallization 36 to the dielectric layer 26. The apparent mechanism for this adherence promotion is that the tungsten islands 32, having dimensions in the 0.1 to 1.0 micron range, macroscopically roughen the dielectric surface 34. Advantageously, in the present invention, the deposition process for the adherence layer 32 does not detrimentally affect the dielectric layer 26. This is in contradistinction to prior art deposition processes wherein a hexafluoride compound is used to etch the surface of a silicon dioxide dielectric. Additionally, the tungsten island adherence layer 32 of the present invention can be used to promote the adhesion of a variety of overlying metallization layers. The described process is not limited to promoting the adhesion of a tungsten or molybdenum metallization layer 36. Since tungsten is a refractory metal the adherence layer 32 maintains its stability over a relatively wide temperature range and it will have a relatively small effect on the properties of both the underlying dielectric and the overlying metallization. In addition, the tungsten islands of the adherence layer 32 are generated so as to be sufficiently small and separated from one another that the dielectric surface 34 remains substantially insulating.

Furthermore, although the invention has been described in terms of a tungsten island adherence layer deposited from an $H_2/WF_6$ mixture, the invention is not so limited. A molybdenum island adherence layer could be similarly chemically vapor deposited from an $H_2/MoF_6$ mixture.

What is claimed is:

1. A method for depositing a metal film on a dielectric surface, comprising the steps of:

exposing the dielectric surface to gaseous $WF_6$ and $H_2$, at a temperature between approximately 500° C. and 650° C., so as to form an adherence layer without etching the dielectric surface, said adherence layer comprising a plurality of discontinuous tungsten islands on the dielectric surface; and thereafter introducing said metal, in gaseous form, to said surface.

2. A method in accordance with claim 1, comprising:
providing the $WF_6$ at a pressure less than approximately 1 Torr.

3. A method in accordance with claim 1, wherein:
the dielectric is selected from the group consisting of polyimide, $Si_3N_4$, $SiO_2$, and PSG.

4. A method in accordance with claim 3, wherein:
said metal is platinum, applied by sputtering.

5. A method in accordance with claim 1, further comprising:

forming a dielectric layer on a silicon substrate, the dielectric layer having an opening which exposes a portion of the silicon substrate; and depositing tungsten onto said exposed substrate portion prior to forming said adherence layer.

6. A method in accordance with claim 1 wherein said tungsten islands are approximately 0.1–1.0 micron in size and cover approximately 10%–90% of the area of said dielectric surface.

7. A method for depositing a metal film on a dielectric surface, comprising the steps of:

exposing the dielectric surface to gaseous $MoF_6$ and $H_2$, at a temperature between approximately 500° C. and 650° C., so as to form an adherence layer without etching the dielectric surface, said adherence layer comprising a plurality of discontinuous molybdenum islands on the dielectric surface; and thereafter introducing said metal, in gaseous form, to said surface.

8. A method in accordance with claim 7 wherein said molybdenum islands are approximately 0.1–1.0 micron in size and cover approximately 10%–90% of the area of said dielectric surface.

* * * * *